US011662410B2

(12) United States Patent
Kettinger et al.

(10) Patent No.: US 11,662,410 B2
(45) Date of Patent: May 30, 2023

(54) METHOD FOR RECORDING DIFFUSION-WEIGHTED MEASUREMENT DATA BY MEANS OF A MAGNETIC RESONANCE SYSTEM

(71) Applicant: Siemens Healthcare GmbH, Erlangen (DE)

(72) Inventors: Adam Kettinger, Bayern (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/484,083

(22) Filed: Sep. 24, 2021

(65) Prior Publication Data
US 2022/0091210 A1 Mar. 24, 2022

(30) Foreign Application Priority Data
Sep. 24, 2020 (DE) .......................... 102020212036.6

(51) Int. Cl.
*G01V 3/00* (2006.01)
*G01R 33/54* (2006.01)
(Continued)

(52) U.S. Cl.
CPC ....... *G01R 33/543* (2013.01); *G01R 33/4835* (2013.01); *G01R 33/5602* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 6,255,820 B1 * 7/2001 Steckner ............ G01R 33/3621
324/309
10,732,243 B2 8/2020 Feiweier
(Continued)

FOREIGN PATENT DOCUMENTS

DE 102019215046 A1 4/2021
EP 3425417 A1 1/2019

OTHER PUBLICATIONS

Spees, William M., et al. Quantification and compensation of eddy-currentinduced magnetic-field gradients. Journal of magnetic resonance, 2011, 212. Jg., Nr.1, S. 116-123.
(Continued)

*Primary Examiner* — Walter L Lindsay, Jr.
*Assistant Examiner* — Frederick W Enderoth
(74) *Attorney, Agent, or Firm* — Banner & Witcoff Ltd.

(57) ABSTRACT

In a method for recording diffusion-weighted measurement data, using a MR system with diffusion weightings with two+ different b-values, diffusion directions and diffusion weightings with the associated b-values to be used for the desired recordings are loaded, a sequence of recordings of measurement data to be recorded consecutively are determined by sorting the diffusion directions and diffusion weightings to be recorded based on their associated b-value, such that the b-value of a recording of measurement data is less than the b-value of the immediately preceding recording of measurement data by no more than a predetermined threshold value, and the recordings are recorded based on the determined sequence. By arranging diffusion encodings for the desired recordings to be used consecutively, abrupt discontinuities in the b-values used chronologically are prevented, thereby eddy current effects from preceding recordings have time to abate in the case of recordings with small b-values.

16 Claims, 3 Drawing Sheets

Figure 1:
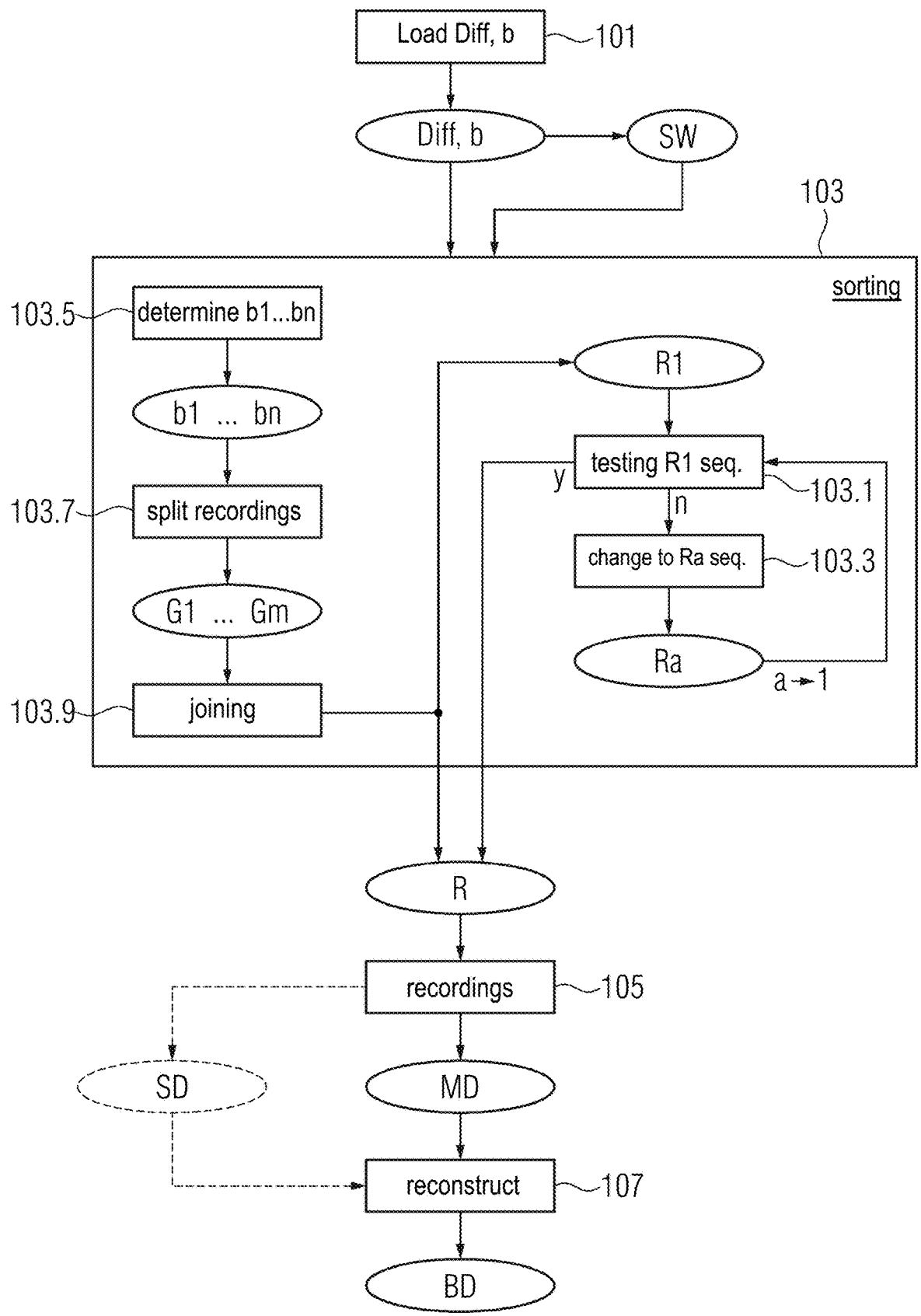

(51) Int. Cl.
*G01R 33/483* (2006.01)
*G01R 33/56* (2006.01)

(58) Field of Classification Search
USPC .......................................................... 324/309
See application file for complete search history.

(56) References Cited

U.S. PATENT DOCUMENTS

| | | | | |
|---|---|---|---|---|
| 2006/0129331 | A1* | 6/2006 | Akilesh | G16B 25/10 435/6.16 |
| 2013/0015855 | A1* | 1/2013 | Machii | A61B 5/7203 324/318 |
| 2016/0110911 | A1* | 4/2016 | Frank | A61B 5/055 382/131 |
| 2017/0023657 | A1* | 1/2017 | Tomoda | G01R 33/543 |
| 2017/0146628 | A1* | 5/2017 | Song | A61B 5/055 |
| 2017/0147908 | A1* | 5/2017 | Chen | G06T 7/0012 |
| 2017/0281041 | A1* | 10/2017 | Yokosawa | A61B 5/7207 |
| 2018/0279878 | A1* | 10/2018 | Nomura | A61B 5/0263 |
| 2021/0096205 | A1 | 4/2021 | Kettinger et al. | |

OTHER PUBLICATIONS

Breuer, Felix A. et al. "Controlled Aliasing in Volumetric Parallel Imaging (2D Caipirinha)", in: Magentic Resonance in Medicine, vol. 55, pp. 549-556, DOI 10.1002/mrm.20787; 2006.
O'Halloran, Rafael et al. "Correction of Artifacts Caused by Transient Eddy Currents in Simultaneous Multi-Slice dMRI" ISMRM—2015, Proc. Intl. Soc. Mag. Reson. Med., 2015; Abstract No. 2931.
Setsompop, Kawin, et al.: "Blipped-controlled aliasing in parallel imaging (blipped-CAIPI) for simultaneous multislice echo planar imaging with reduced g-factor penalty"; in: Magnetic Resonance in Medicine; vol. 67,5; pp. 1210-1224; 2012; DOI 10.1002/mrm.23097; 2012.
German action dated Jul. 24, 2021, Application No. 10 2020 212 036.6.

* cited by examiner

METHOD FOR RECORDING DIFFUSION-WEIGHTED MEASUREMENT DATA BY MEANS OF A MAGNETIC RESONANCE SYSTEM

CROSS REFERENCE TO RELATED APPLICATIONS

This patent application claims priority to German Patent Application No. 10 2020 212 036.6, filed Sep. 24, 2020, which is incorporated herein by reference in its entirety.

BACKGROUND

Field

The disclosure relates to a method for recording diffusion-weighted measurement data by means of a magnetic resonance system with diffusion weightings with at least two different b-values.

Related Art

Magnetic resonance technology (the abbreviation MR below stands for magnetic resonance) is a known technology with which images of the interior of an object under examination can be generated. Put simply, for this purpose the object under examination is positioned in a magnetic resonance device in a comparatively strong static, homogeneous constant magnetic field, also called a $B_0$ field, with field strengths of between 0.2 tesla and 7 tesla and more, such that its nuclear spins are oriented along the constant magnetic field. To trigger nuclear spin resonances that can be measured as signals, radio-frequency excitation pulses (RF pulses) are beamed into the object under examination, the triggered nuclear spin resonances are measured as what are known as k-space data and on the basis thereof MR images are reconstructed or spectroscopy data is determined. For position encoding of the measurement data, rapidly switched magnetic gradient fields, called gradients for short, are overlaid on the constant magnetic field. A diagram used, which describes a temporal sequence of RF pulses to be beamed in and gradients to be switched, is known as a pulse sequence (diagram), or as a sequence for short. The measurement data plotted, also called raw data, is digitized and saved as complex numerical values in a k-space matrix. An associated MR image can be reconstructed from the k-space matrix populated with values, e.g. by means of a multidimensional Fourier transform.

Normally a magnetic resonance recording consists of a plurality of individual partial measurements, in which raw data from different slices of the object under examination is recorded, in order then to reconstruct volume image data therefrom.

However, for many examinations it is additionally also necessary to carry out multiple, i.e. a whole series of, magnetic resonance recordings of the object under examination, wherein one particular measurement parameter is varied. On the basis of the measurements the effect of this measurement parameter on the object under examination is observed, in order then subsequently to draw diagnostic conclusions therefrom. A series in this case means at least two, but generally more than two, magnetic resonance recordings. It makes sense in this case for a measurement parameter to be varied such that the contrast of a particular type of material excited during the measurements, for example of one type of tissue of the object under examination or of a chemical substance which is significant for most or particular types of tissue, such as e.g. water, is influenced as strongly as possible by the variation of the measurement parameter. This ensures that the effect of the measurement parameter on the object under examination is particularly readily visible.

A typical example of series of magnetic resonance recordings subject to variation of a measurement parameter strongly influencing the contrast are what are known as "diffusion weighting imaging" (DWI) methods. Diffusion means the Brownian motion of molecules in a medium. In diffusion imaging, multiple images with different diffusion directions and weightings are generally recorded and combined with one another. The strength of the diffusion weighting is mostly defined by what is known as the "b-value". The diffusion images with different diffusion directions and weightings or the images combined therefrom can then be used for diagnostic purposes. Thus using suitable combinations of the recorded diffusion-weighted images, parameter maps with particular diagnostic relevance can be generated, for example maps which show the "Apparent Diffusion Coefficient (ADC)" or the "Fractional Anisotropy (FA)".

Diffusion imaging is frequently based on echo planar imaging (EPI) because of the short acquisition time of the EPI sequence per image and its robustness in respect of movement. In diffusion imaging using EPI, distortions, e.g. shear strains or compressions, as well as signal voids, or also where appropriate attenuated fat saturation, even without a movement of the patient, which can additionally play a role, can occur in the diffusion-weighted images because of local $B_0$ inhomogeneities and residual eddy current fields. The latter depend on the direction and strength of the diffusion weighting. These distortions can lead to errors in the evaluated diffusion maps. These difficulties occur to a particularly large degree if a standard Steijskal-Tanner diffusion encoding is used.

In diffusion-weighted imaging additional gradients are inserted into a pulse sequence in order to make the diffusion properties of the tissue visible or to measure them. These gradients mean that tissue with a fast diffusion (e.g. cerebrospinal fluid (CSF)) is subject to a stronger signal loss than tissue with a slower diffusion (e.g. the gray matter in the brain). The resultant diffusion contrast is becoming clinically ever more significant and applications now go well beyond the traditional early identification of ischemic stroke.

A multiplicity of image-based correction methods are already known for correcting or at least reducing artifacts caused by eddy currents. One of these methods uses a technique that is also called dynamic field correction. This uses a separate recording of reference data, on the basis of which a spatial registration of MR images with different diffusion directions and b-values is performed in succession.

Since what are known as simultaneous multi-slice imaging techniques (SMS techniques), in which a tuple of slices are recorded at the same time, have been increasingly used, a further problem for MR imaging caused by eddy currents can be added to this which depends on the imaging parameters of the pulse sequence used. It can happen that different slices of a slice tuple exhibit the aforementioned problems caused by eddy currents to differing degrees, e.g. different degrees of spatial displacements and/or compressions, such that slices lying spatially next to one another are offset against one another.

Examples of known SMS methods include what is known as Hadamard encoding, methods using simultaneous echo refocusing, methods using broadband data recording and methods that employ parallel imaging in the slice direction. Examples of the latter methods also include the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, p. 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, p. 1210-1224.

U.S. Pat No. 10,732,243 describes a method in which a sequence of diffusion gradients to be applied one after the other is optimized in order to minimize the overall measurement time of diffusion-weighted measurements. The idea on which the technique described there is based is to distribute recordings that have different diffusion encodings (i.e. various diffusion weightings and various diffusion directions) as homogeneously as possible in a progression over time of the overall measurement, in order to distribute the heat load on the hardware components (in particular the gradient coils) as evenly as possible to the various gradient axes. If the time of heating characteristically assigned to a hardware component is longer than the typical application time of a diffusion gradient, this approach permits a type of averaging of the heat load over various gradient encodings. As a result, the need for explicit cooling phases can be reduced, which in turn means that the overall measurement period is reduced.

However, a procedure such as this increases the likelihood that measurements with a high b-value occur immediately prior to measurements with a low b-value, in particular b-value=zero, and can thus intensify effects caused by eddy currents.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 shows a schematic flow chart of a method according to an exemplary embodiment.

Figure 2:
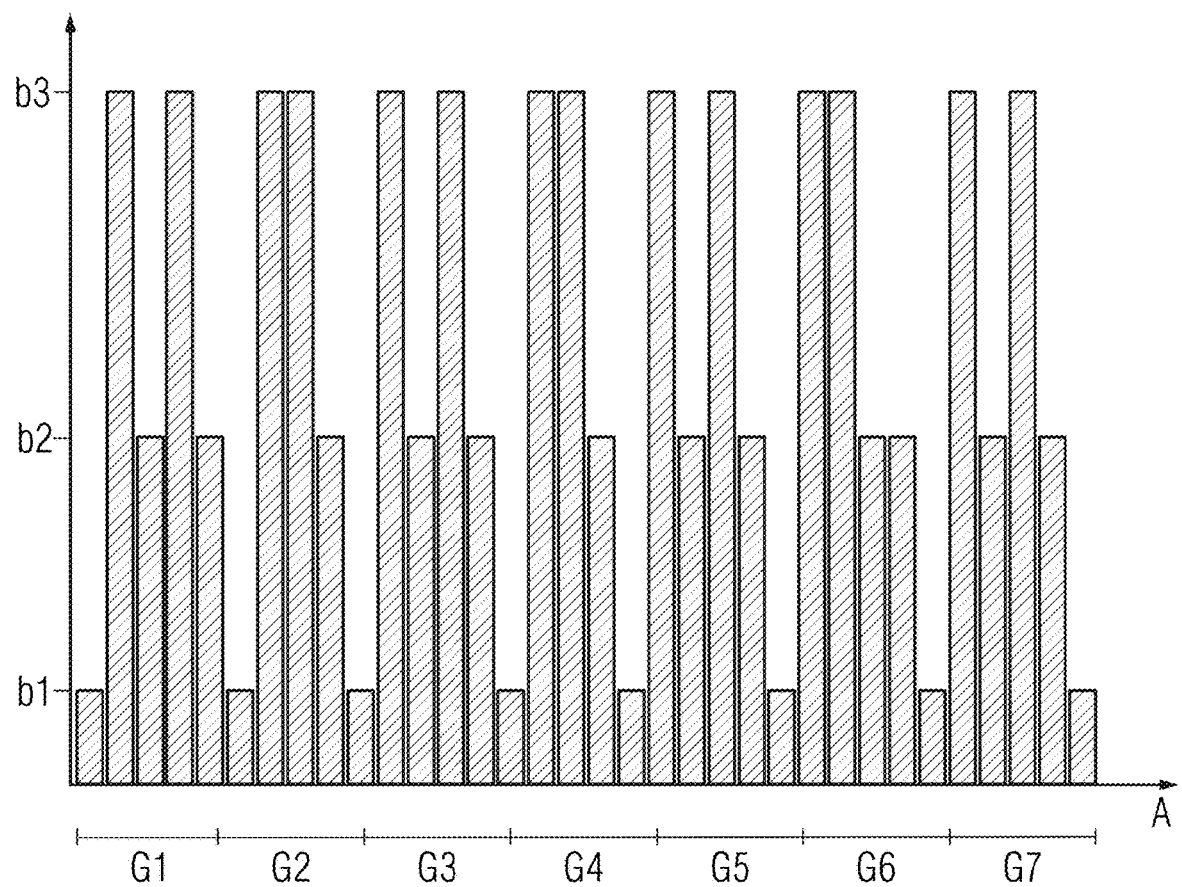

FIG. 2 schematically shows an example of an inventive sequence of b-values to be used in desired recordings, according to an exemplary embodiment.

Figure 3:
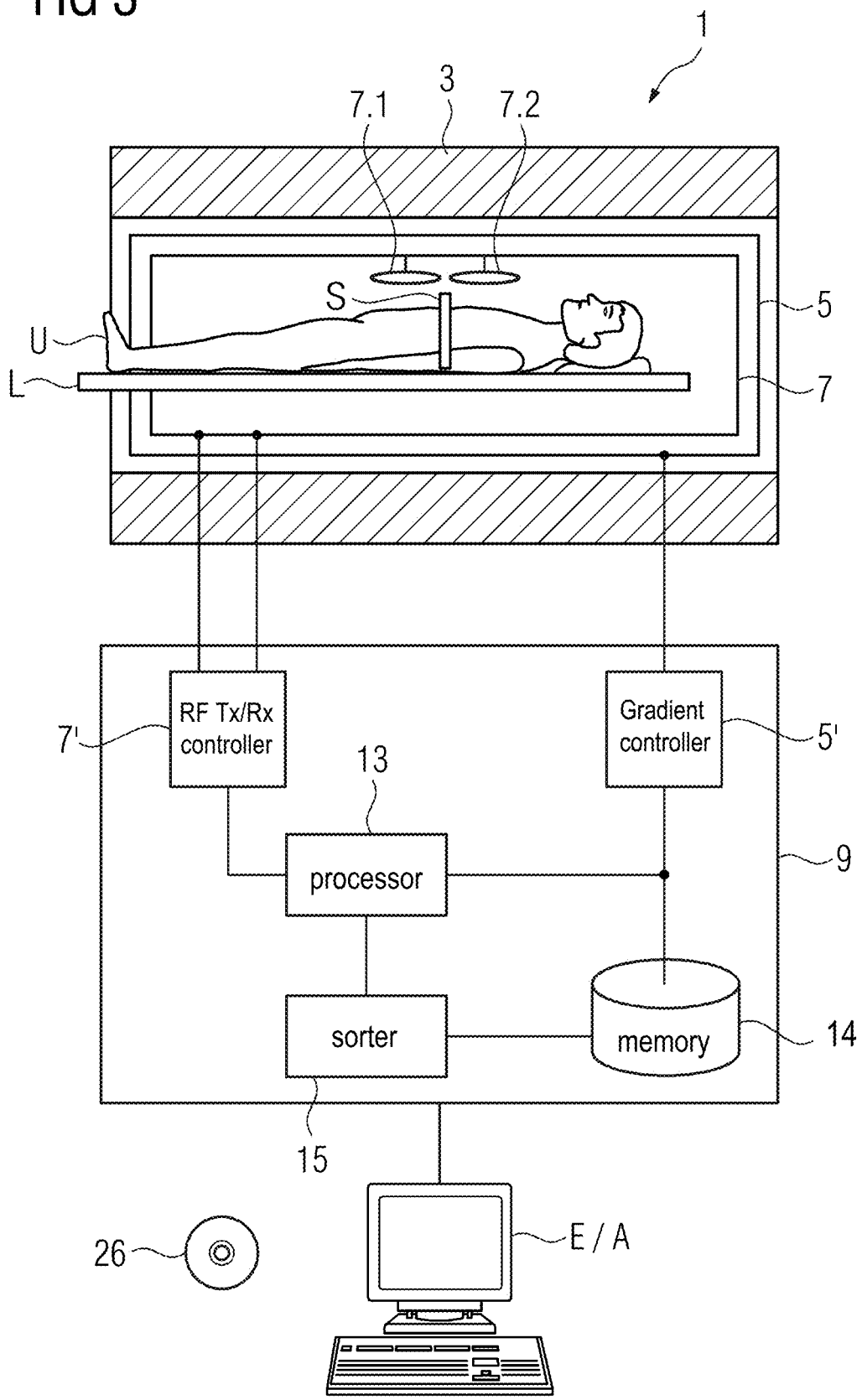

FIG. 3 shows a schematically represented inventive magnetic resonance system according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to allow recordings of diffusion-weighted measurements influenced as little as possible by eddy current effects, in particular with a heat load equalized as much as possible, in the shortest possible time.

The object is achieved by a method for recording diffusion-weighted measurement data by means of a magnetic resonance system with diffusion weightings with at least two different b-values, a magnetic resonance system, a computer program, and an electronically readable data storage medium according to the disclosure.

The disclosure is based inter alia on the following knowledge: in particular in SMS techniques, if a slice tuple is recorded, without a diffusion gradient being switched (b-value=zero), and immediately prior to this a slice tuple has been recorded in which a strong diffusion gradient was switched, different slices of the b=0 tuple can exhibit the aforementioned problems caused by eddy currents to differing degrees, e.g. different degrees of spatial displacements and/or compressions, such that slices lying spatially next to one another are offset in respect of one another.

One of the reasons for this effect is the eddy currents that are induced by the diffusion gradients that during the recording of the slice tuples were recorded with the high b-value, and that have still not completely abated when the next slice tuple is recorded, in particular if this has only a low b-value or simply a b-value=zero.

This can also occur analogously in single-slice techniques. However, reasons why this effect occurs more frequently or more prominently in SMS techniques than in single-slice techniques are that for SMS techniques a monopolar diffusion encoding diagram is regularly used, that SMS techniques permit a significant reduction in the time of repetition TR (as a result of which eddy current effects have less time to abate), and that thanks to the simultaneous encoding and recording of multiple slices by means of the SMS technique this effect, which otherwise would appear at most in edge regions of the recorded slice packages, here also becomes visible in central regions.

An effect such as this is for example already described in the article by O'Halloran et al. "Correction of Artifacts Caused by Transient Eddy Currents In Simultaneous Multi-Slice dMRI" Proc. Intl. Soc. Mag. Reason. Med. 23, 2015, page 2931.

An inventive method, according to an exemplary embodiment, for recording diffusion-weighted measurement data by means of a magnetic resonance system with diffusion weightings with at least two different b-values comprises the operations:

loading the diffusion directions and diffusion weightings with the associated b-values to be used for the desired recordings, determining a sequence of recordings of measurement data to be recorded consecutively by sorting the diffusion directions and diffusion weightings to be recorded in accordance with their associated b-value, such that the b-value of a recording of measurement data is less than the b-value of the immediately preceding recording of measurement data by no more than a predetermined threshold value, performance of the recordings to be recorded in accordance with the determined sequence.

By arranging diffusion encodings for the desired recordings to be used consecutively in an inventive sequence, abrupt discontinuities downward in the b-values used chronologically one after the other are prevented, as a result of which eddy current effects from preceding recordings have time to abate in the case of recordings with small b-values. In particular it is possible to prevent a recording with the b-value b=0 following on directly in time from a recording with a high b-value.

An inventive magnetic resonance system according to an exemplary embodiment comprises a magnet unit, a gradient unit, a radio-frequency unit and a controller with a sorting unit designed to perform an inventive method.

An inventive computer program implements an inventive method on a controller when it is executed on the controller.

The computer program can here also be present in the form of a computer program product that can be loaded directly into a memory of a controller, with program encoding means to execute an inventive method when the computer program product is executed in the processor of the computing system.

An inventive electronically readable data storage medium comprises electronically readable control information stored thereon, which comprises at least one inventive computer program and is configured such that it performs an inventive method when the data storage medium is used in a controller of a magnetic resonance system.

The advantages and explanations specified in respect of the method also apply analogously for the magnetic resonance system, the computer program product and the electronically readable data storage medium.

FIG. 1 is a schematic flow chart of a method for recording diffusion-weighted measurement data, according to an exemplary embodiment, by means of a magnetic resonance system with diffusion weightings with at least two different b-values.

The diffusion directions and diffusion weightings Diff with the associated b-values b to be used for the desired recordings to be performed for the desired diffusion-weighted measurement data are loaded (Block 101).

A sequence R of recordings of measurement data MD to be recorded consecutively is determined by sorting the diffusion directions and diffusion weightings Diff to be recorded in accordance with their respective associated b-value, such that the b-value of a recording of measurement data is less than the b-value of the immediately preceding recording of measurement data by no more than a predetermined threshold value (Block 103).

The threshold value SW can here depend on the b-values b to be used for the desired recordings. For example, the threshold value SW can be fixed as less than the difference between the largest b-value and the smallest b-value of the desired recordings (but greater than the difference between the second-smallest b-value and the smallest b-value of the desired recordings), such that the threshold value SW at least ensures that a recording with the largest b-value of the desired recordings does not immediately precede a recording with the smallest b-value of the desired recordings. In each case the threshold value SW is chosen such that in particular consecutive recordings taking place immediately prior to recordings with the lowest b-value of the desired recordings have b-values descending as slowly as possible to the lowest b-value.

The sorting 103 can comprise testing a first sequence R1 of the recordings to be recorded for fulfillment of the cited threshold value condition (Block 103.1). A first sequence R1 can for example be a random sequence or a sequence of the recordings to be recorded that is customary in line with the current state of knowledge. The testing can here also be restricted to testing recordings with the highest b-values of the desired recordings, e.g. the b-values that are larger than the threshold value plus the lowest of the b-values of the desired recordings, and the respective subsequent recordings in the first sequence, in order to save computing time.

If the testing shows that the first sequence R1 fulfills the threshold value condition (103.1, "y"), the first sequence R1 can be used as the sequence R to be used for the desired recordings.

If the threshold value condition (103.1, "n") is not fulfilled, the first sequence R1 is changed to a changed sequence Ra (Block 103.3).

A changed sequence Ra can once again be tested for fulfillment of the threshold value condition (Block 103.1), such that the changed sequence Ra is tested as a new first sequence ("a→1").

The change in the first sequence R1 can comprise transposing consecutive recordings in the first sequence R1 that have not fulfilled the threshold value condition. In this way the discontinuity in the b-values in the consecutive recordings assessed as too large compared to the threshold value is changed from the undesired "small follows large" into an unproblematic "large follows small".

The change in the first sequence R1 into a changed sequence Ra can also comprise a displacement of the recording with the smaller b-value of the consecutive recordings in the first sequence R1 that have not fulfilled the threshold value condition. For example, the recording with the smaller b-value of the consecutive recordings in the first sequence R1 that have not fulfilled the threshold value condition can be displaced further backward by one recording or also, at least once, completely to the start in the sequence. In this way it is at least iteratively ensured that the threshold value condition is fulfilled for all consecutive recordings.

Additionally or alternatively it is also conceivable for the change in the first sequence R1 to comprise an insertion of a special recording for the recording of special data (SD) between the consecutive recordings in the first sequence that have not fulfilled the threshold value condition. A special recording need not fulfill the threshold value condition since the special data recorded with it is not included with the measurement data MD from which image data BD can be reconstructed. Instead, calibration data can for example be recorded as special data SD, which e.g. can be used in SMS techniques for separating simultaneously recorded slices. Since the special data is thus recorded in special recordings that immediately follow a recording of measurement data with a high b-value, it can gainfully be employed directly in the reconstruction of image data BD from measurement data MD, which has likewise been recorded in recordings that immediately follow a recording of measurement data with a high b-value.

The sorting 103 can also comprise splitting the recordings to be recorded into groups G1 ... Gm, said groups G1 ... Gm each comprising recordings with different b-values of the b-values of the desired recordings (Block 103.7). To this end it can initially be determined which different b-values b1 ... bn have to be achieved for the desired recordings and if appropriate in each case how often a determined b-value b1 ... bn has to be achieved (Block 103.5). The split into groups G1 ... Gm, each with different b-values, means the sequence of the recordings collected together to form a group can be constructed faster, such that the threshold value condition is fulfilled.

For example, a number n of different b-values b1 ... bn to be used for the desired recordings can be determined, and each group G1 ... Gm can comprise at least one of the n determined different b-values. Thus the different b-values are distributed to all groups G1 ... Gm, thereby enabling a balanced distribution of the b-values of the desired recordings and thus of the load acting on the gradient unit.

Splitting the recordings to be made into groups G1 ... Gm can further comprise fixing the sequence of the b-values included in a group G1 ... Gm, such that b-values of the consecutive recordings desired within a group have b-values decreasing at least to a lowest b-value. By fixing the sequence of recordings within a group G1 ... Gm such that at least the recordings taking place immediately prior to a recording with a lowest b-value within the group each have b-values decreasing monotonically down to the lowest b-value, it can be ensured that the threshold value condition between the groups is fulfilled.

As a further condition for fixing a sequence within a group of recordings to be performed consecutively, attention can further be paid to as balanced a distribution as possible of the loads on the gradient axes.

An example with three b-values b1, b2 and b3 and seven groups G1 ... G7 is presented below with reference to FIG. 2.

The determined groups G1 ... Gm can be joined to one another to determine a sequence R (103.9). It is also conceivable to subject a sequence made up of the determined groups G1 ... Gm as a first sequence R1 to a further test 103.1 in order where appropriate to achieve further optimizations of the sequence.

The recordings to be recorded are performed in accordance with the determined sequence R (Block 105), in order to record measurement data MD. In this case the recordings of the measurement data MD can take place by means of a simultaneous multi-slice (SMS) technique, in order to reduce the measurement time required overall compared to single-slice techniques. The measurement data MD recorded in connection with the recordings can be reconstructed to form image data BD (Block 107). If the sequence R also comprises special recordings, with which special data (SD) has been recorded, these can be used to assist with the reconstruction of the image data BD, e.g. for calibration.

In an exemplary diffusion measurement using an SMS technique with an acceleration factor=2 and 11 recordings in total, with 3 times b=0, and in each case 4 times (in four different diffusion directions r1, r2, r3, r4) b=500 and b=2000, the 11 recordings can for example be arranged in the following inventive sequence:

$b=0 \rightarrow b=2000 \ (r1) \rightarrow b=500 \ (r1) \rightarrow b=0 \rightarrow b=2000 \ (r2) \rightarrow b=500 \ (r2) \rightarrow b=2000 \ (r3) \rightarrow b=500 \ (r3) \rightarrow b=2000 \ (r4) \rightarrow b=500 \ (r4) \rightarrow b=0$ Thanks to an inventive sequence of this type, signal losses and other negative effects caused by eddy currents can be reduced or even prevented.

FIG. 2 is a schematic representation of an example of an inventive sequence of b-values to be used in desired recordings, according to an exemplary embodiment.

By way of example, a diffusion measurement which wants 14 recordings with a b-value b3, 12 recordings with a b-value b2, with b2<b3, and 8 recordings with a b-value b1, with b1<b2, is represented. The smallest b-value b1 could also, without any restriction of generality, correspond to the value b=0. For more than three different b-values the considerations made herein apply analogously.

It is additionally conceivable to divide more than three different b-values in accordance with their strength into three groups, e.g. "high", "medium" and "low", and to equalize these groups with the represented b-values b3 ("high"), b2 ("medium") and b1 ("low").

In the sequence represented, a recording A with the b-value b2, but not with the b-value b3, occurs prior to each recording A with the b-value b1. Were a recording A with a b-value b1 to follow a recording A with a b-value b3, the threshold value condition would be violated.

The sequence represented can be determined by testing a first sequence and if appropriate changing this into a changed sequence, or can be understood as being determined by being split into seven groups G1, G2, G3, G4, G5, G6 and G7. Each group G1 to G7 comprises recordings with all three different b-values b1, b2 and b3. In accordance with the number of the different b-values (three) the last three recordings of each group have monotonically decreasing b-values.

The group G6 represented for example even has overall only recordings with monotonically decreasing b-values.

In the groups G1, G3, G5 and G7, recordings A with the b-values b3 and b2 alternate in each case at the start of the group. In this way a heat load on the gradient unit is better distributed, in order to prevent excessive heating.

A recording with the smallest b-value b1 was placed right at the start of the sequence (e.g. in connection with a change in a first sequence as described above). The threshold value condition is fulfilled for the first two recordings in an inventive sequence if the first recording has a small, in particular the smallest, b-value of the b-values associated with the desired recordings.

The diffusion directions belonging to a recording can, once the sequence of the b-values is fixed, e.g. be assigned to a suitable b-value, such that as few direction changes as possible are necessary, so that recordings take place as continuously as possible consecutively in one diffusion direction. It is likewise conceivable for the diffusion directions belonging to a recording to be assigned to suitable b-values in the inventively fixed sequence, such that the diffusion directions of consecutive recordings in the sequence are ideally anti-parallel. As a result, it can be achieved that eddy currents are compensated faster. Alternatively, the diffusion directions needed for the desired recordings can also be distributed randomly to the associated b-values in the determined sequence.

The inventive method thus permits desired recordings to be arranged in a sequence, such that although different diffusion encodings (diffusion weightings and diffusion directions) are not maximally homogeneously distributed, nevertheless abrupt discontinuities in the b-values of consecutive recordings downward are prevented. In particular, the sequence in which the desired recordings with the different diffusion encodings are to take place consecutively can be chosen such that recordings with b-value b=0 do not immediately follow recordings with b-values that generate strong eddy current effects.

FIG. 3 schematically represents an inventive magnetic resonance system 1 according to an exemplary embodiment. This comprises a magnet unit 3 for generating the constant magnetic field, a gradient unit 5 for generating the gradient fields, a radio-frequency unit 7 for beaming and for receiving radio-frequency signals and a controller 9 configured to perform an inventive method. In an exemplary embodiment, the controller 9 includes processing circuitry that is configured to perform one or more functions and/or operations of the controller 9.

In FIG. 3 these subunits of the magnetic resonance system 1 are only roughly schematically represented. In particular, the radio-frequency unit 7 can consist of multiple subsidiary units, for example of multiple coils such as the schematically shown coils 7.1 and 7.2 or more coils, that can be configured either only to transmit radio-frequency signals or only to receive the triggered radio-frequency signals or for both.

To examine an object under examination U, for example a patient or else a phantom, the latter can be introduced into the measurement volume of the magnetic resonance system 1 on a patient couch L. The slice or the slab S represents an exemplary target volume of the object under examination, from which data is to be recorded and captured as measurement data. The magnet unit 3, gradient unit 5, and radio-frequency unit 7 collectively form an MR scanner.

In an exemplary embodiment, the controller 9 is configured to control the magnetic resonance system 1 and can in particular control the gradient unit 5 by means of a gradient controller 5' and the radio-frequency (RF) unit 7 by means of a radio-frequency transmit/receive controller 7'. The radio-frequency unit 7 can here comprise multiple channels on which signals can be transmitted or received.

The radio-frequency unit 7 is responsible, together with its radio-frequency transmit/receive controller 7', for generating and beaming (transmitting) a radio-frequency alternating field for manipulation of the spins in a region to be manipulated (for example in slices S to be measured) of the object under examination U. In this case the center frequency of the radio-frequency alternating field, also called the B1 field, is generally where possible set such that it lies close to the resonance frequency of the spins to be manipulated. Deviations of the center frequency from the resonance frequency are called off-resonance. To generate the B1 field, currents controlled by means of the radio-frequency transmit/receive controller 7' are applied to the RF coils in the radio-frequency unit 7.

In an exemplary embodiment, the controller 9 further comprises a sorting unit 15, with which inventively desired recordings with different b-values are sorted into a sequence to be performed in which the desired recordings are to follow consecutively. The controller 9 is configured overall to perform an inventive method.

A processor 13 comprised by the controller 9 is configured to execute all computing operations needed for the necessary measurements and determinations. Interim results and results required for this or determined hereby can be stored in a memory 14 of the controller 9. The units represented are here not necessarily to be understood as physically separate units, but merely represent a classification into meaningful units, which however can also be implemented e.g. in fewer or even in just one single physical unit.

Control commands to the magnetic resonance system can be routed and/or results of the controller 9 such as e.g. image data can be displayed via an input/output device E/A of the magnetic resonance system 1, e.g. by a user.

A method described herein can also be present in the form of a computer program product which comprises a program and implements the described method on a controller 9 when it is executed on the controller 9. Likewise, an electronically readable data storage medium 26 with electronically readable control information stored thereon can be present, said information at least comprising a computer program product of the type just described and being configured such that it performs the described method when the data storage medium 26 is used in a controller 9 of a magnetic resonance system 1.

The invention claimed is:

1. A method for recording diffusion-weighted measurement data using a magnetic resonance (MR) system with diffusion weightings with at least two different b-values, the method comprising:
    loading diffusion directions and diffusion weightings with the associated b-values to be used for desired recordings;
    determining a sequence of recordings of measurement data to be recorded consecutively, by sorting the diffusion directions and diffusion weightings to be recorded in accordance with their associated b-value, such that a threshold value condition is fulfilled, wherein the threshold value condition includes a b-value of a recording of measurement data being less than a b-value of the immediately preceding recording of measurement data by no more than a predetermined threshold value, and
    controlling the MR system to perform the recordings to be recorded based on the determined sequence to record the diffusion-weighted measurement data, and providing an electronic signal representing the recorded diffusion-weighted measurement data as an output of the MR system.

2. A magnetic resonance (MR) system for recording diffusion-weighted measurement data using a magnetic resonance (MR) system with diffusion weightings with at least two different b-values, the MR system comprising:
    a MR scanner; and
    a controller configured to:
    access diffusion directions and diffusion weightings with the associated b-values to be used for desired recordings;
    determine a sequence of recordings of measurement data to be recorded consecutively, by sorting the diffusion directions and diffusion weightings to be recorded in accordance with their associated b-value, such that a threshold value condition is fulfilled, wherein the threshold value condition includes a b-value of a recording of measurement data being less than a b-value of the immediately preceding recording of measurement data by no more than a predetermined threshold value, and
    control the MR scanner to: perform the recordings to be recorded based on the determined sequence to record the diffusion-weighted measurement data, and provide an electronic signal representing the recorded diffusion-weighted measurement data as an output of the controller.

3. The method as claimed in claim 1, wherein the threshold value depends on the b-values to be used for the desired recordings.

4. The method as claimed in claim 1, wherein the sorting comprises testing a first sequence of the recordings to be recorded for fulfillment of the threshold value condition, and in response to the threshold value condition not being fulfilled, the first sequence is changed to form a changed sequence.

5. The method as claimed in claim 4, further comprising testing a changed sequence for fulfillment of the threshold value condition.

6. The method as claimed in claim 4, wherein the change in the first sequence comprises a transposition of consecutive recordings in the first sequence that have not fulfilled the threshold value condition.

7. The method as claimed in claim 4, wherein the change in the first sequence comprises a displacement of the recording with the smaller b-value of the consecutive recordings in the first sequence that have not fulfilled the threshold value condition.

8. The method as claimed in claim 4, wherein the change in the first sequence comprises an insertion of a special recording for recording special data between the consecutive recordings in the first sequence that have not fulfilled the threshold value condition.

9. The method as claimed in claim 1, wherein the sorting comprises a division of the recordings to be recorded into groups each comprising recordings with different b-values.

10. The method as claimed in claim 9, wherein a number of different b-values to be used for the desired recordings is determined, and each group comprises at least one of the number of determined different b-values.

11. The method as claimed in claim 9, wherein within one of the groups, consecutive recordings have b-values decreasing at least to a lowest b-value.

12. The method as claimed in claim 1, wherein the recordings take place by a simultaneous multi-slice (SMS) technique.

13. The method as claimed in claim 1, wherein:
the diffusion directions to be used are assigned to associated b-values randomly in the sequence,
the direction changes are minimized in consecutive diffusion directions, or
the assigned diffusion directions in consecutive recordings are ideally anti-parallel.

14. A computer program product, embodied on a non-transitory computer-readable storage medium, having executable code that is loadable directly into a memory of a controller of a magnetic resonance system, when executed, causes the controller to perform the method of claim 1.

15. A non-transitory computer-readable storage medium with an executable program stored thereon, that when executed, instructs a processor to perform the method of claim 1.

16. The method as claimed in claim 1, further comprising reconstructing image data based on the recorded diffusion-weighted measurement data.

* * * * *